United States Patent [19]

Mulford

[11] Patent Number: 5,575,002

[45] Date of Patent: Nov. 12, 1996

[54] METHOD FOR MUTING A RADIO

[75] Inventor: Keith I. Mulford, Arlington Heights, Ill.

[73] Assignee: Motorola, Inc., Schaumburg, Ill.

[21] Appl. No.: 332,213

[22] Filed: Oct. 31, 1994

[51] Int. Cl.$^6$ ................................................ H04B 1/16
[52] U.S. Cl. ................ 455/194.1; 455/35.1; 455/54.1; 455/70; 455/212
[58] Field of Search .................................. 455/194.1, 68, 455/70, 92, 89, 35.1, 54.1, 212, 218, 219, 220, 222, 355, 200.1, 38.2, 88

[56] References Cited

U.S. PATENT DOCUMENTS

| | | | |
|---|---|---|---|
| 4,517,561 | 5/1985 | Burke et al. | 360/825.07 |
| 4,905,279 | 2/1990 | Nishio | 380/9 |
| 5,133,082 | 7/1992 | White | 455/35.1 |
| 5,170,499 | 12/1992 | Grothause | 455/238.1 |
| 5,212,809 | 5/1993 | Oka | 455/54.1 |
| 5,355,531 | 10/1994 | Iwata et al. | 455/219 |
| 5,390,341 | 2/1995 | Ziniel | 455/54.1 |

FOREIGN PATENT DOCUMENTS 8301875  5/1983  WIPO ................. 455/218

*Primary Examiner*—Reinhard J. Eisenzopf
*Assistant Examiner*—Lee Nguyen
*Attorney, Agent, or Firm*—Nedra D. Karim; Susan L. Lukasik

[57] ABSTRACT

When a portable radio (110) receives a transmission from a mobile radio (105), the portable radio (110) mutes a speaker volume of the portable radio (110) for a duration of the transmission from the mobile radio (105). In an arrangement of the mobile radio (105) and the portable radio (110) where both radios transmit and receive on a same communication resource channel and both radios are in close proximity, acoustic feedback may be avoided.

34 Claims, 2 Drawing Sheets

METHOD FOR MUTING A RADIO

FIELD OF THE INVENTION

This invention relates to acoustic feedback avoidance including, but not limited to, acoustic feedback avoidance between radios.

BACKGROUND OF THE INVENTION

Recently, public safety agencies have increasingly adopted a practice of equipping an officer with a mobile radio and a portable radio both operating on a same channel. While in the vehicle, the officer typically uses the mobile radio and while away from the vehicle, the officer uses the portable radio. In this manner, the officer is able to stay in communication whether the officer is in the vehicle or on foot away from the vehicle. This arrangement, however, may create an acoustic feedback problem in the vehicle when the officer transmits on one of the radios while the other radio is on. For example, when the officer is in the vehicle and transmits on the mobile radio while the portable radio is on, audio from the transmitting radio (mobile) is transmitted to a repeater and repeated to the portable radio. The audio may alternatively be transmitted directly from the mobile radio to the portable radio without the use of the repeater. The portable radio receives the audio and amplifies the audio through a speaker of the portable radio. When the audio is amplified through the speaker, feedback is created to a microphone of the mobile radio. This feedback is an acoustic feedback loop and creates a loud disruptive noise. Further, when feedback occurs, it disrupts the transmission from the transmitting radio thereby prohibiting the transmission from reaching an intended radio.

One technique used to resolve the acoustic feedback problem is to turn down the volume on the portable radio when transmitting on the mobile radio. While operational, this approach has several shortfalls. Turning down the volume of the portable radio may solve the noise problem, however, it may create a more significant problem. When the officer leaves the vehicle, the officer may easily forget to turn up the volume on the portable radio. By not turning up the volume on the portable radio, the officer is isolated from the communication system. The officer will not be able to hear messages being transmitted.

A second technique used to resolve the acoustic feedback problem involves a communication system where a user presses a button to initiate a muting operation. This action causes the mobile radio to send a mute request command to an infrastructure, typically, via a controlled channel. This mute request command includes an ID of a portable radio which is to be muted. The infrastructure in turn transmits an outbound muting command targeted for the portable radio. When muting is no longer desired, an unmute command is transmitted from the mobile radio to the infrastructure to reverse the process. This technique further includes a door switch system that causes the mobile radio to transmit the unmute command whenever the vehicle door is opened.

While this technique seems to work well, there are a few disadvantages. The technique relies on toggling commands which are repeated through an intelligent infrastructure. A one time message to mute or unmute the portable radio may be missed due to interference. The portable radio does not mute or unmute when desired if the portable radio does not receive the mute or unmute commands. Multiple retry operations may be specified in case a command does not get through on a first attempt. Retry operations cause the infrastructure to be loaded down with mute and unmute commands.

Further, once muted, the portable radio mutes all incoming messages indiscriminately. Depending on the implementation, a signaling failure may result in the portable radio not unmuting (if optional portable radio acknowledgment is not used) or the portable radio may create feedback for a time period during which the mobile radio is waiting and retrying to get a mute command through to the portable radio. Thus, communications to the portable radio may be eliminated by false muting or disrupted by a delay in execution of the mute function. Since the portable radio mutes all inbound transmissions, regardless of whether the transmission would create feedback or not, this significantly increases the possibility that a portable radio user may miss a message.

Relying on a door switch (or other change of state indicator) to disable the mute function is not a fool proof option since the officer may leave the vehicle without the automatic unmute function being executed. Officers often return to their vehicles, leave the door open, and use the mobile radio. If the officer presses a mobile mute button, uses the mobile radio, and then leaves the vehicle without closing and then opening the door, the portable radio remains muted. The officer may not be aware that the portable radio is still muted. When the officer leaves the vehicle, messages received by the portable radio are muted thus, the officer does not hear the messages. This could create a potentially dangerous situation for the officer if someone is trying to warn the officer of a life threatening situation. Furthermore, wiring a door switch additionally complicates installation of the mobile radio into the vehicle. The operation of pressing the mute button each time the officer returns to the vehicle (or opens the door) complicates the operation of the radio. The probability that the officer will forget to press the mute button may be high, especially when the officer is in a hurry or under stress.

Therefore, there is a need for an improved acoustic feedback avoidance method that is simple, that does not add additional loading to the infrastructure, and that does not rely on a user to press a button to activate.

DESCRIPTION OF THE PREFERRED EMBODIMENT

Figure 1:
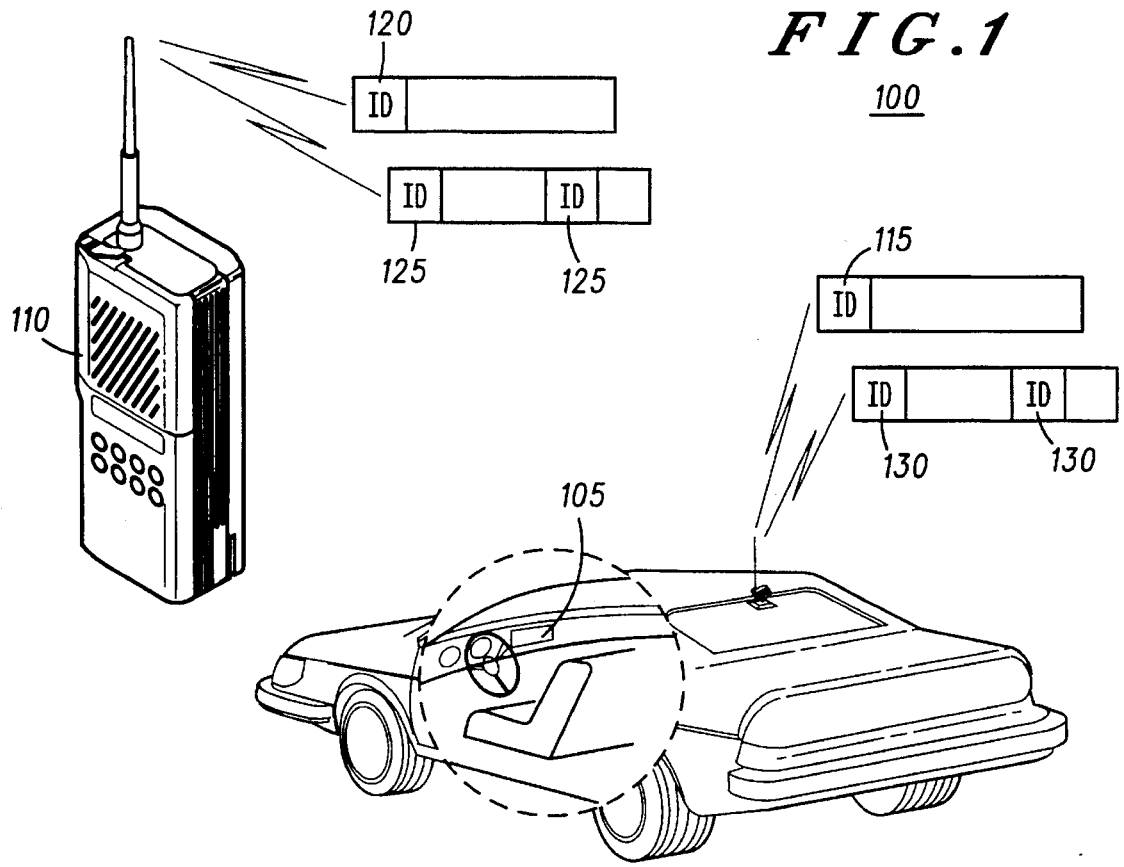
FIG. 1 is a block diagram illustrating a portable radio and a mobile radio suitable for demonstrating the present invention.

Briefly, in accordance with the present invention, there is disclosed a method for muting a portable radio in an arrangement of a mobile radio and the portable radio, where both radios transmit and receive digitally on a same communication resource channel, and where each radio has a unique ID. When the portable radio receives a transmission, the portable radio determines an ID of a transmitting radio based on the transmission. When the ID of the transmitting radio matches an ID of the mobile radio, the portable radio mutes a speaker volume of the portable radio thereby avoiding acoustic feedback between the portable radio and the mobile radio. In this manner, the portable radio selectively mutes transmissions originating from the mobile radio while allowing transmissions originating from other radios to be amplified by the speaker of the portable radio.

The ID of the mobile radio may be entered via at least one manual button and then stored in the portable radio. The ID of the mobile radio may alternatively be entered by placing the portable radio in a learning mode, where the portable radio is capable of learning the ID from a message transmitted by the mobile radio. The mobile radio transmits the message where the message includes the ID of the mobile radio. The portable radio receives the message, determines the ID of the mobile radio, and stores the ID of the mobile radio.

Additionally, in place of a full muting operation, the speaker of the portable radio may be partially muted to a preset level. The speaker may then be unmuted by restoring the speaker volume of the portable radio to a previous level when the transmission ends. Alternatively, when the speaker volume is muted, a low-level audio tone may be provided to a user of the portable radio during the transmission. The low level tone may then be disabled when the transmission ends.

Additionally, the speaker volume may be automatically unmuted when the transmission ends, thereby restoring the portable radio to normal operation. Alternatively, the portable radio may be unmuted by manually operating at least one button of the portable radio, thereby restoring the portable radio to normal operation.

An indication that the portable radio is muted may be displayed on a display of the portable radio. When the transmission ends, the indication is removed from the display of the portable radio.

Further, in accordance with the present invention, there is also disclosed a method for muting the mobile radio in an arrangement of the mobile radio and the portable radio, where both radios transmit and receive digitally on the same communication resource channel, and where each radio has a unique ID. When the mobile radio receives a transmission, the mobile radio determines an ID of a transmitting radio based on the transmission. When the ID of the transmitting radio matches an ID of the portable radio, the mobile radio mutes a speaker volume of the mobile radio thereby avoiding acoustic feedback between the portable radio and the mobile radio. In this manner, the mobile radio selectively mutes transmissions originating from the portable radio while allowing transmissions originating from other radios to be amplified by the speaker of the mobile radio.

The ID of the portable radio may be entered via at least one manual button and then stored in the mobile radio. The ID of the portable radio may alternatively be entered by placing the mobile radio in a learning mode, where the mobile radio is capable of learning the ID from a message transmitted by the portable radio. The portable radio transmits the message where the message includes the ID of the portable radio. The mobile radio receives the message, determines the ID of the portable radio, and stores the ID of the portable radio.

Additionally, in place of a full-mute operation, the speaker of the mobile radio may be partially muted to a preset level. The speaker may then be unmuted by restoring the speaker volume of the mobile radio to a previous level when the transmission ends. Alternatively, when the speaker volume is muted, a low-level audio tone may be provided to a user of the mobile radio during the transmission. The low level tone may then be disabled when the transmission ends.

Additionally, the mobile radio may be automatically unmuted when the transmission ends, thereby restoring the mobile radio to normal operation. Alternatively, the mobile radio may be unmuted by manually operating at least one button of the portable radio, thereby restoring the mobile radio to normal operation.

An indication that the mobile radio is muted may be displayed, on a display of the mobile radio. When the transmission ends, the indication is removed from the display of the mobile radio.

The present invention can be more fully described with reference to FIG. 1–FIG. 4. FIG. 1 illustrates a block diagram of a mobile radio 105 and a portable radio 110 in accordance with the present invention. The mobile radio 105 and the portable radio 110 both transmit and receive digitally on a same communication resource channel and each radio has a unique ID. When the mobile radio 105 transmits a message, the message includes the ID of the mobile radio 115. Likewise, when the portable radio 110 transmits a message, the message includes the ID of the portable radio 120. In this manner, a receiving radio, portable or mobile, can determine the ID of a transmitting radio. In a system based on an APCO (Association of Public Safety Communications Officials International, Inc.) Project 25 standard for public safety digital radio systems, a message transmitted by the mobile radio 105 or the portable radio 110 includes an ID portion that is repeated at intervals throughout the message. For example, when the mobile radio 105 transmits a message, the message includes an ID portion 130 that is repeated several times throughout the message. Likewise, when the portable radio 110 transmits a message, the message includes an ID portion 125 that is repeated several times throughout the message.

Figure 2:
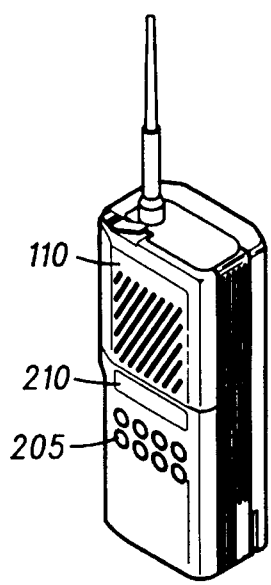
FIG. 2 is a block diagram of a first radio of FIG. 1.

FIG. 2 illustrates the portable radio 110 including a keypad 205 and a display 210. The keypad 205 may be used by a user of the portable radio 110 to manually input the ID of the mobile radio 105 via at least one manual button. Once entered, the mobile ID is then stored in the portable radio 110. More than one mobile ID may be entered via the keypad 205 and stored by the portable radio 110. The keypad 205 may also be used to place the portable radio 110 in a learn mode such that the portable radio 110 determines the mobile radio ID from a received message. The keypad 205 may also be used by the user to unmute the portable radio 110 by manually pressing at least one button of the keypad 205 thereby restoring the portable radio 110 to normal operation.

Figure 3:
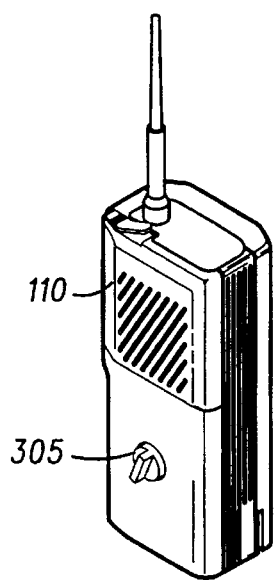
FIG. 3 is a block diagram of a second radio of FIG. 1.

FIG. 3 illustrates the portable radio 110 including a knob 305. The knob 305 may be a multi-position knob that is used to perform several functions. The knob 305 may be used to place the portable radio 110 in a learn mode as described above. The knob 305 may also be used to unmute the portable radio 110 manually when the user wants to override the mute function. The knob 305 may further be used to re-enable the mute function of the portable radio 110 when the mute function has been previously disabled by use of the knob 305. Alternatively, the knob 305 may be a momentary knob for the learn mode or the knob 305 may be a push-on/push-off knob where push-on may be used to disable the mute function and push-off may be used to re-enable the mute function when the mute function has been previously disabled by the push-on knob. One skilled in the art can easily recognize that the radio depicted in FIG. 2 and FIG. 3 may be a portable radio, a mobile radio, or any other type of communication device in a communication system.

Figure 4:
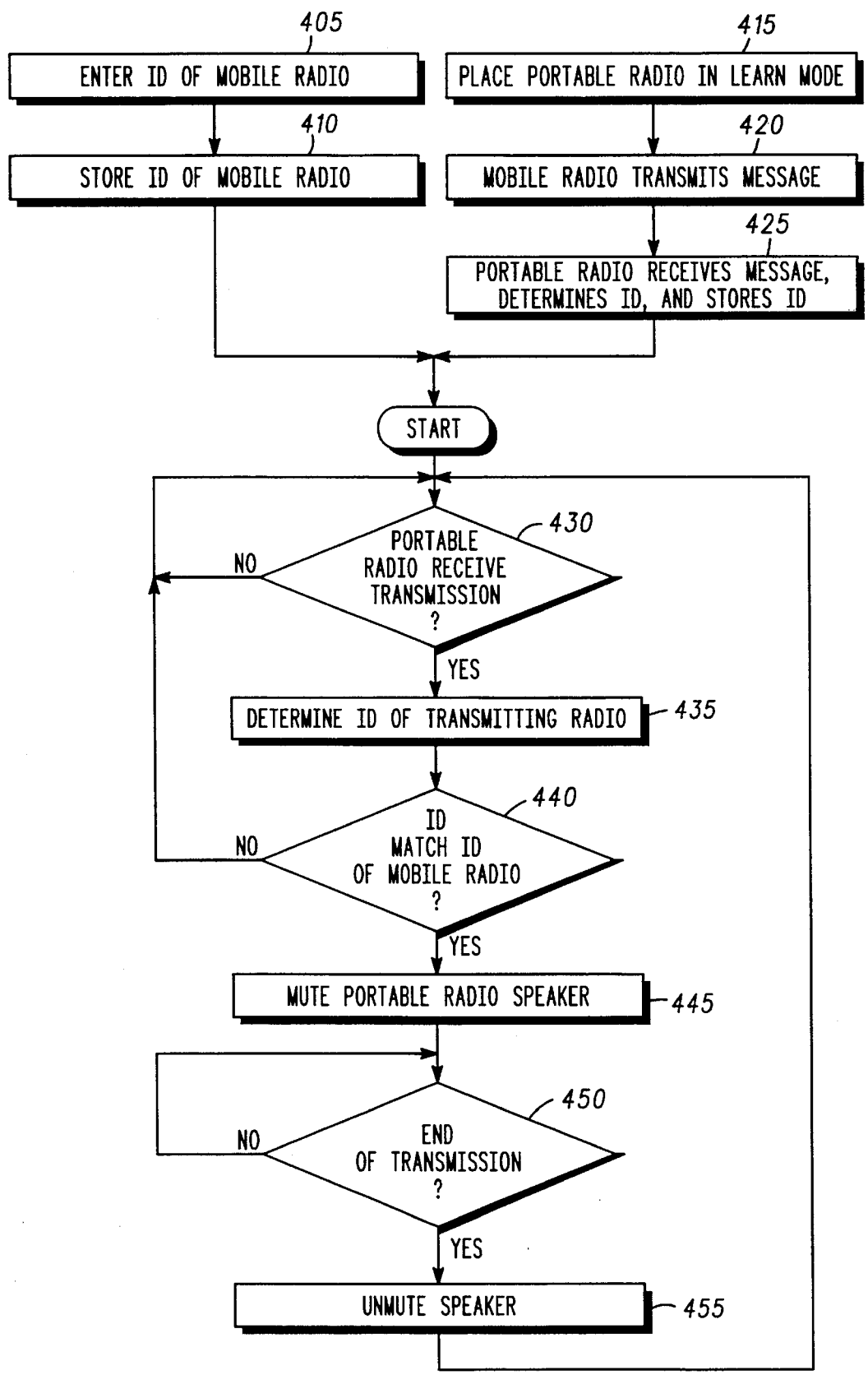
FIG. 4 is a logic diagram that a radio may use to implement the present invention.

FIG. 4 is a logic diagram that a portable radio may use to implement the present invention. Steps 405–425 illustrate initial steps that may be used to enter at least one mobile radio ID into the portable radio. Steps 405 and 410 illustrate a first method that allows manual entry of the mobile radio ID into the portable radio. In the alternative, steps 415–425 illustrate a second method of mobile radio ID entry into the portable via the learn mode of operation. In the first method, at step 405, the ID of the mobile radio is entered into the portable radio via manual keys on the portable radio. For example, a user may enter a sequence of one or more keys on the keypad of the portable radio. At step 4 10, the ID of mobile radio is stored in memory of the portable radio. In the second method, at step 415, the portable radio is placed in a learn mode. The learn mode is entered via at least one manual button on the portable radio. At step 420, the mobile radio transmits a message that includes the ID of the mobile radio. At step 425, the portable radio receives the message, determines the ID of the mobile radio, and stores the ID in memory.

Once the portable radio has the ID of the mobile radio in memory, the process continues when the portable radio receives a transmission at step 430. When the portable radio receives a transmission 430, the portable radio determines the ID of the transmitting radio at step 435. If the ID matches the stored ID of the mobile radio at step 440, the portable radio mutes the speaker volume of the portable radio at step 445. If the ID does not match the stored ID of the mobile radio at step 440, the portable radio does not mute the speaker, thereby allowing the received transmission to reach the speaker as in normal operation. The process then returns to step 430 where the portable radio waits to receive another transmission.

At step 445, there are several methods the portable radio may use to mute the speaker. One method involves the portable radio partially muting the speaker volume to a preset level. A second method includes the portable radio completely muting the speaker volume of the portable radio. A third method entails the portable radio providing a low level audio tone to a user of the portable radio during the transmission in addition to muting the speaker volume.

After the portable radio has been muted at step 445, the portable radio checks for the end of the transmission or whether the mobile ID is no longer present at step 450. If the transmission has ended or the mobile ID is no longer present 450, the portable radio is unmuted at step 455. There are several methods in which the portable radio may be unmuted. These methods depend on which method was used to mute the portable radio at step 445. One method of unmuting the portable radio includes restoring the speaker volume to a previous level when the transmission ends. This method is used when the speaker volume has been partially muted to a preset level. A second method includes disabling the low level audio tone and unmuting the portable radio speaker when the transmission ends. This method is used when the low level audio tone was provided at step 445. A third method includes unmuting the portable radio speaker automatically when the transmission ends thereby restoring the portable radio to normal operation.

An optional function may be for an indication that the portable radio is muted to be displayed on a display of the portable radio. When the transmission ends, the indication is then removed from the display. A second optional function includes unmuting the portable radio when a user manually operates at least one button on the portable radio thereby restoring the portable radio to normal operation and overriding the selective muting operation. The second option may be performed at any time during operation of the portable radio. For example, if the user unmutes the portable radio manually, when the portable radio receives a transmission from the mobile radio, the speaker of the portable radio is not muted. Similarly, if the portable radio is muted and the user manually unmutes the portable radio before the transmission ends, the portable radio unmutes the speaker allowing the transmission to pass to the speaker even though the transmission is from the mobile radio. One skilled in the an can easily recognize that the logic diagram illustrated in FIG. 4 may be implemented by a portable radio, a mobile radio, or any other type of communication device.

The present invention eliminates acoustic feedback between a pair of radios that transmit and receive on a same communication resource and are located in close proximity. The present invention may be extended to multiple radios, for example, when more than one officer is assigned to the same car and where each officer has a portable radio and the car has a mobile radio.

A preferred embodiment includes a digital radio system in which each radio has a unique ID which is transmitted continuously within every message. In the present invention, a portable radio assigned to an individual is programmed to recognize the unique ID of a "sister" mobile radio transmission. If the portable radio receives an inbound transmission that includes the unique ID of the sister mobile radio, the portable radio automatically mutes the portable radio speaker for a duration of the transmission. When the officer transmits using the mobile radio, the portable radio recognizes the transmission and automatically mutes the portable radio speaker thus, avoiding acoustic feedback between the radios. The present invention applies to direct radio to radio transmissions and transmissions repeated through an infrastructure. The present invention may be successfully implemented in both conventional and trunked communication systems.

The present invention has several key advantages over prior art methods. First, the present invention provides a highly reliable method of eliminating acoustic feedback without operator assistance, i.e., operation is totally transparent to a user of the radio. Secondly, the radio implementing the present invention only mutes a transmission from its sister radio and passes all other transmissions, thus, reducing a chance for the radio user to unknowingly be without live audio. Thirdly, the present invention does not utilize special messages to initiate a mute function. Further, the present invention does not require the mobile radio to be disabled when the user leaves the vehicle. There is no need for a set/reset style of operation. Due to the continuous nature of the present invention, retry style subsystems are not necessary. Exit door switches or manual overrides are not required. Still further, the present invention provides a higher reliability of operation with less opportunity for feedback and less opportunity for an officer to have a portable radio unintentionally muted while the officer is away from the vehicle. Additionally, control channel traffic is not increased by the use of the present invention in a communication system.

While various embodiments of a method of avoiding acoustic feedback between radios, in accordance with the present invention, have been described hereinabove, the scope of the invention is defined by the following claims.

I claim:

1. In an arrangement of a mobile radio and a portable radio, wherein both radios transmit and receive digitally on a communication resource, and wherein the mobile radio has a first ID, a method for muting the portable radio, comprising the steps of:

at the portable radio, wherein the first ID is stored within the portable radio:

(a) receiving a transmission that was transmitted by transmitting radio having a second ID, wherein the transmission includes at least the second ID;

(b) determining the second ID of the transmitting radio based on the transmission; and (c) when the second ID of the transmitting radio matches the first ID of the mobile radio, muting a speaker volume of the portable radio, thereby avoiding acoustic feedback between the portable radio and the mobile radio.

2. The method of claim 1, further comprising a preceding step of:

at the portable radio:

entering the first ID of the mobile radio via at least one manual button and storing the first ID of the mobile radio.

3. The method of claim 2, wherein the muting step (c) further includes a step of partially muting the speaker volume of the portable radio to a preset level.

4. The method of claim 3, further comprising a subsequent step (d) of unmuting the speaker volume of the portable radio by restoring the speaker volume of the portable radio to a previous level when the transmission ends.

5. The method of claim 2, wherein the muting step (c) further includes a step of, at the portable radio, providing a low-level audio tone to a user of the portable radio during the transmission.

6. The method of claim 5, further comprising a subsequent step (d) of disabling the low-level audio tone when the transmission ends.

7. The method of claim 2, further including a subsequent step (d) of, at the portable radio, unmuting the portable radio by manually operating at least one button of the portable radio, thereby restoring the portable radio to normal operation.

8. The method of claim 2, further comprising a subsequent step (d) of, at the portable radio, automatically unmuting the speaker volume of the portable radio when the transmission ends, thereby restoring the portable radio to normal operation.

9. The method of claim 1, further comprising the preceding steps of:

(a1) at the portable radio, placing the portable radio in a learning mode, whereby the portable radio learns the first ID of the mobile radio;

(a2) at the mobile radio, transmitting a message wherein the message includes the first ID of the mobile radio; and (a3) at the portable radio, receiving the message, and thereby determining the first ID of the mobile radio, and storing the first ID of the mobile radio.

10. The method of claim 9, wherein the muting step (c) further includes a step of partially muting the speaker volume of the portable radio to a preset level.

11. The method of claim 10, further comprising a subsequent step (d) of unmuting the speaker volume of the portable radio by returning the speaker volume of the portable radio to a previous level when the transmission ends, thereby restoring the portable radio to normal operation.

12. The method of claim 9, wherein the muting step (c) further includes a step of, at the portable radio, providing a low-level audio tone to a user of the portable radio during the transmission.

13. The method of claim 12, further comprising a subsequent step (d) of disabling the low-level audio tone when the transmission ends.

14. The method of claim 9, further including a subsequent step (d) of, at the portable radio, unmuting the portable radio by manually operating at least one button of the portable radio, thereby restoring the portable radio to normal operation.

15. The method of claim 9, further comprising a subsequent step (d) of, at the portable radio, automatically unmuting the speaker volume of the portable radio when the transmission ends, thereby restoring the portable radio to normal operation.

16. The method of claim 1, further comprising a subsequent step (d) of, at the portable radio, displaying, on a display of the portable radio, an indication that the portable radio is muted.

17. The method of claim 16, further comprising a subsequent step (e) of, at the portable radio, removing, from the display of the portable radio, the indication that the portable radio is muted when the transmission ends.

18. In an arrangement of a mobile radio and a portable radio, wherein both radios transmit and receive digitally on a communication resource, and wherein the portable radio has a first ID, a method for muting the mobile radio, comprising the steps of:

at the mobile radio, wherein the first ID is stored within the mobile radio:

(a) receiving a transmission that was transmitted by a transmitting radio having a second ID, wherein the transmission includes at least the second ID;

(b) determining the second ID of the transmitting radio based on the transmission; and (c) when the second ID of the transmitting radio matches the first ID of the portable radio, muting a speaker volume of the mobile radio, thereby avoiding acoustic feedback between the portable radio and the mobile radio.

19. The method of claim 18, further comprising a preceding step of:

at the mobile radio:

entering the first ID of the portable radio via at least one manual button and storing the first ID of the portable radio.

20. The method of claim 19, wherein the muting step (c) further includes a step of partially muting the speaker volume of the mobile radio to a preset level.

21. The method of claim 20, further comprising a subsequent step (d) of unmuting the speaker volume of the mobile radio by returning the speaker volume of the mobile radio to a previous level when the transmission ends, thereby restoring the mobile radio to normal operation.

22. The method of claim 19, wherein the muting step (c) further includes a step of, at the mobile radio, providing a low-level audio tone to a user of the mobile radio during the transmission.

23. The method of claim 22, further comprising a subsequent step (d) of disabling the low-level audio tone when the transmission ends, thereby restoring the mobile radio to normal operation.

24. The method of claim 19, further including a subsequent step (d) of, at the mobile radio, unmuting the mobile radio by manually operating at least one button of the mobile radio, thereby restoring the mobile radio to normal operation.

25. The method of claim 19, further comprising a subsequent step (d) of, at the mobile radio, automatically unmuting the speaker volume of the mobile radio when the transmission ends, thereby restoring the mobile radio to normal operation.

26. The method of claim 18, further comprising the preceding steps of:
(a1) at the mobile radio, placing the mobile radio in a learning mode, whereby the mobile radio learns the first ID of the portable radio;
(a2) at the portable radio, transmitting a message wherein the message includes the first ID of the portable radio; and
(a3) at the mobile radio, receiving the message, and thereby determining the first ID of the portable radio, and storing the first ID of the portable radio.

27. The method of claim 26, wherein the muting step (c) further includes a step of partially muting the speaker volume of the mobile radio to a preset level.

28. The method of claim 27, further comprising a subsequent step (d) of unmuting the speaker volume of the mobile radio by returning the speaker volume of the mobile radio to a previous level when the transmission ends, thereby restoring the mobile radio to normal operation.

29. The method of claim 26, wherein the muting step (c) further includes a step of, at the mobile radio, providing a low-level audio tone to a user of the mobile radio during the transmission.

30. The method of claim 29, further comprising a subsequent step (d) of disabling the low-level audio tone when the transmission ends.

31. The method of claim 26, further including a subsequent step (d) of, at the mobile radio, unmuting the mobile radio by manually operating at least one button of the mobile radio, thereby restoring the mobile radio to normal operation.

32. The method of claim 26, further comprising a subsequent step (d) of, at the mobile radio, automatically unmuting the speaker volume of the mobile radio when the transmission ends, thereby restoring the mobile radio to normal operation.

33. The method of claim 18, further comprising a subsequent step (d) of, at the mobile radio, displaying, on a display of the mobile radio, an indication that the mobile radio is muted.

34. The method of claim 33, further comprising a subsequent step (e) of, at the mobile radio, removing, from the display of the mobile radio, the indication that the mobile radio is muted when the transmission ends.

* * * * *